United States Patent [19]

Nagata

[11] 4,379,268
[45] Apr. 5, 1983

[54] DIFFERENTIAL AMPLIFIER CIRCUIT

[75] Inventor: Mitsuru Nagata, Yokohama, Japan

[73] Assignee: Tokyo Shibaura Denki Kabushiki Kaisha, Kawasaki, Japan

[21] Appl. No.: 171,755

[22] Filed: Jul. 24, 1980

[30] Foreign Application Priority Data

Aug. 30, 1979 [JP] Japan ............................... 54-110702

[51] Int. Cl.$^3$ ............................................. H03F 3/45
[52] U.S. Cl. ..................................... 330/260; 330/257; 330/261
[58] Field of Search ............... 330/252, 254, 257, 260, 330/261; 307/264, 564, 567

[56] References Cited

U.S. PATENT DOCUMENTS 4,197,505  4/1980  Nishijima et al. ............... 330/261 X
4,241,315  12/1980  Patterson et al. .................. 330/261

Primary Examiner—James B. Mullins
Attorney, Agent, or Firm—Finnegan, Henderson, Farabow, Garrett & Dunner

[57] ABSTRACT

A differential amplifier circuit having constant mutual conductance characteristics. The circuit comprises first and second differential amplifier units in which each of the emitters of two transistors are connected to a common constant current source via respective diode-junction stacks or resistors. The bases of the individual transistors in the first amplifier unit are connected to different ones of the transistors in the second amplifier unit. On the other hand, the collectors of the individual transistors of the first unit are connected to different ones of the collectors of the second unit, wherein the bases are not connected to each other. Further, the diode-junction stacks or the resistors in the same amplifier unit have the same numbers of diodes or the same resistance, but differ between the amplifier units.

8 Claims, 9 Drawing Figures

4,379,268

DIFFERENTIAL AMPLIFIER CIRCUIT

FIELD OF THE INVENTION

This invention relates to a differential amplifier circuit, and more particularly, to a differential amplifier circuit which has a mutual conductance (gm) characteristic with good linearity.

BACKGROUND OF THE INVENTION

It has been hoped to obtain an amplifier circuit having a good linear response characteristic and a good linear impedance-varying characteristic. However, it has been found that the linearities of the response and impedance-varying characteristics of conventional circuits using transistors are insufficient because conventional transistors exhibit non-linear mutual conductance characteristics varying with input voltage.

Therefore, conventional transistor amplifier circuits require negative feedback for restraining their non-linearities. But negative feedback decreases the gain of an amplifier circuit. In the past, many efforts have been made for improving the linearity of amplifier circuits.

SUMMARY OF THE INVENTION

It is, therefore, an object of the present invention to provide a differential amplifier circuit having a good linear mutual conductance (gm) characteristic which is flat over a wide range of input voltages.

Another object of the present invention is to provide a differential amplifier circuit having a good gm characteristic and comprising transistors the emitters of which all have equal areas.

According to the present invention, the differential amplifier circuit comprises: (a) four transistors; (b) four sets of junction diode stacks, each diode stack being respectively connected to the emitter of a separate one of the transistors; (c) a pair of constant current sources, each source being commonly connected to ends of different pairs of the diode stacks, resulting in a pair of differential circuits; (d) a pair of input terminals, each input terminal being commonly connected to the bases of a first pair of the transistors, the transistors of each first pair of transistors lying in different differential circuits and (e) a pair of output connection nodes, each output connection node being commonly connected to the collectors of a second pair of the transistors, the transistors of each second pair lying in different differential circuits and having respective bases connected to different input terminals.

Additional objects and advantages of the present invention will become apparent to persons skilled in the art from a study of the following description of the accompanying drawings, in which:

BRIEF DESCRIPTION OF THE DRAWINGS

FIG. 1b is a graph showing gm characteristic curves of the circuit shown in FIG. 1a;

FIGS. 6 to 8 show circuit diagrams of other differential amplifier circuits embodying the present invention.

DESCRIPTION OF THE PREFERRED EMBODIMENTS

Figure 1A:
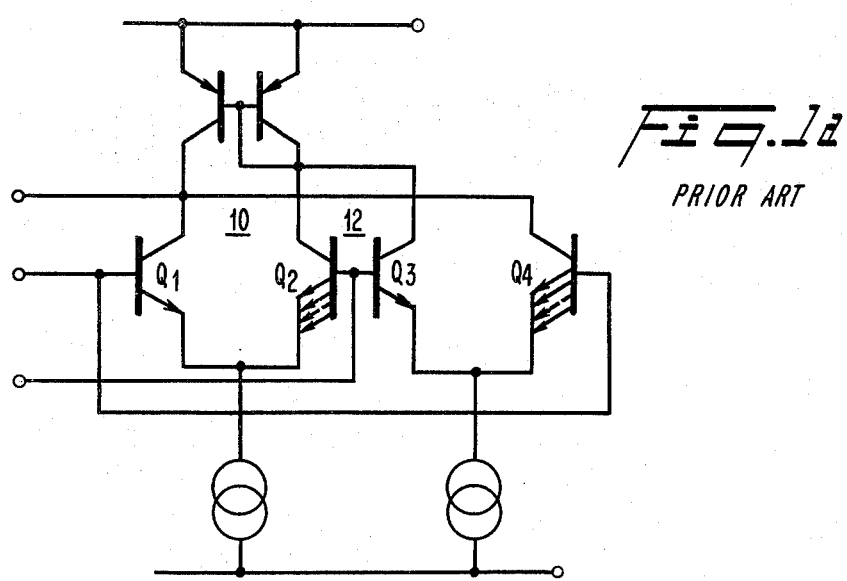
FIG. 1a shows a circuit diagram of a differential amplifier circuit of the prior art.

The present invention will be described in detail with reference to the accompanying drawings FIG. 1a to FIG. 8. Throughout the drawings, like reference numerals will be used to designate like or equivalent portions, for the sake of simplicity of explanation.

Figure 1B:
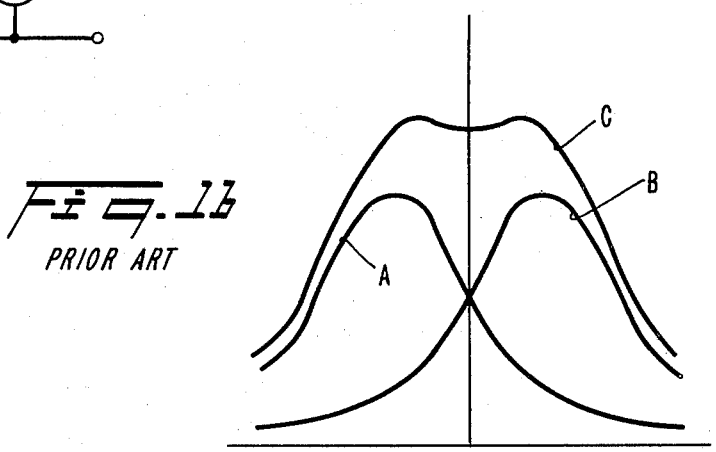

The prior art to which this invention is an improvement includes a circuit using a pair of differential amplifier units as shown in FIG. 1a. This prior art circuit is being used as an automatic level control (ALC) circuit in an integrated circuit (IC) being manufactured by the assignee of this invention. The circuit basically includes a pair of differential amplifier units 10 and 12 which are connected in parallel. Each amplifier unit 10 or 12 has a pair of transistors, $Q_1$, $Q_2$, and $Q_3$, $Q_4$, one of the transistors in each unit having an emitter with a larger area than that of the other transistor in the unit. The differential amplifier units 10 and 12 have gm characteristics with graphs denoted A and B, respectively, in FIG. 1b. As a result, the whole circuit has gm characteristics shown in the graph denoted by C in FIG. 1b, the graph C being consolidated from graphs A and B.

The gm characteristic of the whole circuit as shown in graph C, is relatively flat about its center portion. However, the circuit shown in FIG. 1a has a few limitations as described below. First, the center portion of the gm characteristic curve of graph C becomes flat under the condition that the emitter area ratio between the transistors $Q_1$, $Q_2$, or $Q_3$, $Q_4$ in each differential amplifier unit 10 or 12 is 1:4. As the ratio differs from 1:4, the center portion of the graph C becomes round upwards or downwards. Secondly, the other transistor in each differential amplifier unit needs to have a very large area for its emitter to obtain a good gm characteristic with a flat portion about its center so that the whole circuit becomes larger in its size.

Figure 2:
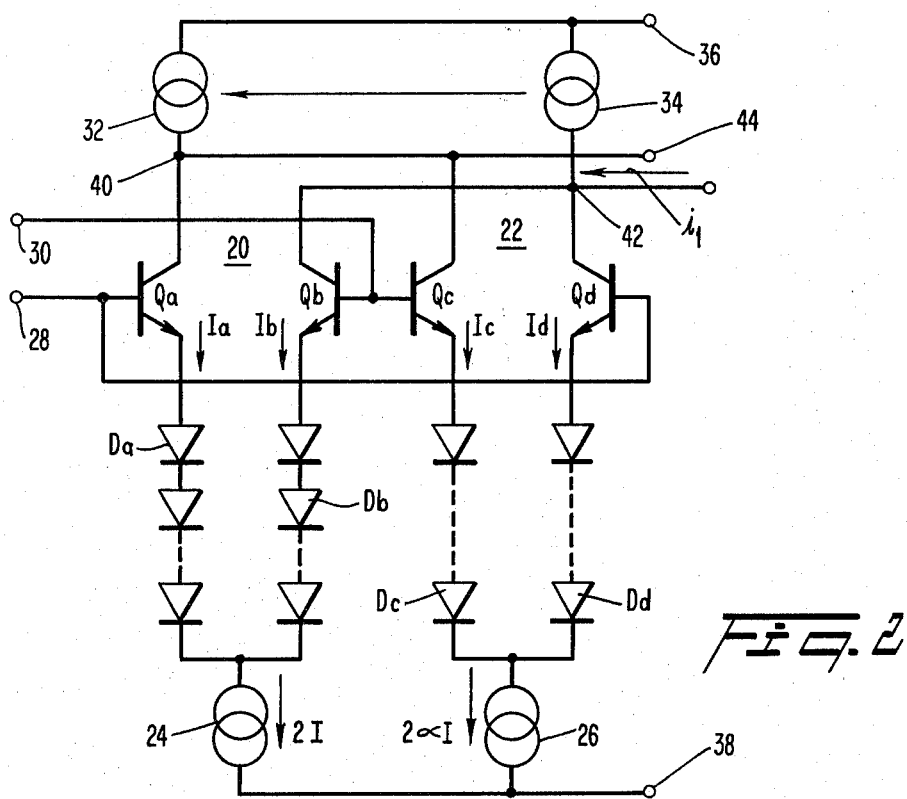
FIG. 2 shows a circuit diagram of a differential amplifier circuit embodying the present invention.

Referring now to FIG. 2, there is shown a differential amplifier circuit of one embodiment, according to this invention, which comprises two differential amplifier units 20 and 22. Each amplifier unit 20 and 22 is basically constructed by a pair of NPN transistors $Q_a$ and $Q_b$, or $Q_c$ and $Q_d$, and a pair of diode stacks $D_a$ and $D_b$, or $D_c$ and $D_d$, with a constant current source 24 or 26 connected to corresponding ends of the stacks respectively.

In each amplifier unit, the other ends of the diode stacks $D_a$, $D_b$, $D_c$ and $D_d$ are respectively connected to the emitters of the transistors $Q_a$, $Q_b$, $Q_c$ and $Q_d$. One end of the first constant current source 24 is connected in common to corresponding ends of diode stacks $D_a$ and $D_b$ in the first amplifier unit 20. Similarly, one end of the second constant current source 26 is connected in common to corresponding ends of diode stacks $D_c$ and $D_d$ in the second amplifier unit 22.

The second constant current source 26 supplies a current of $\alpha$ times the current supplied from the first constant current source 24, where $1 > \alpha > 0$. As a result, the current source 26 supplies smaller current than that of the current source 24.

The bases of the transistor $Q_a$ in the first amplifier unit 20 and the transistor $Q_d$ in the second amplifier unit 22 are connected in common to an input terminal 28 and similarly the bases of the transistor $Q_b$ in the first amplifier unit 20 and the transistor $Q_c$ in the second amplifier unit 22 are connected in common to an input terminal 30.

Further, the collectors of the transistor $Q_a$ in the first amplifier unit 20 and the transistor $Q_c$ in the second amplifier unit 22 are connected to an output connection node 44 which is connected to a first reference voltage source terminal 36 through a third constant current source 32. Similarly, the collectors of the transistor $Q_b$ in the first amplifier unit 20 and the transistor $Q_d$ in the second amplifier unit 22 are connected to another output connection node 42 which is connected to the first reference voltage source terminal 36 through a fourth constant current source 34. The third and fourth constant current sources 32 and 34 supply the same amount of current to each other by means of a current mirror circuit connection and work as active loads for the respective amplifier units.

The other ends of the first and second constant current sources 24 and 26 are connected in common to a second reference voltage source terminal 38.

In the differential amplifier circuit constructed as above, the diode stacks $D_a$ and $D_b$ in the first amplifier unit 20 have the same number of diodes, e.g., (N-1), where N represents a positive integer number. Similarly, the stacks $D_c$ and $D_d$ in the second amplifier unit 22 have the same number of diodes, but a lesser number than that of the first amplifier unit 20, e.g., (M-1), where M represents a positive integer. The diode stacks having the greater number of diodes are thus associated with the current source 24 supplying the larger current.

Accordingly, there are N numbers of diode junctions along each current path from the collector of the first transistor $Q_a$ or from the second transistor $Q_b$ to the first constant current source 24, including the base-emitter junction of the transistor $Q_a$ or $Q_b$. Similarly, there are M number of diode junctions along each current path from the collector of the third transistor $Q_c$ or from the fourth transistor $Q_d$ to the second constant current source 26, including the base-emitter junction of the transistor $Q_c$ or $Q_d$. The numbers N and M can be freely selected but under the condition that the numbers are different from each other. In the preferred embodiment N is larger than M as stated above.

Now, for help of consideration, we shall discuss the gm characteristics of only one differential amplifier unit, taking the amplifier unit 20 as an example before explaining about the operation of the whole circuit.

We consider that when an input signal with voltage Vin is supplied across the input terminals 28 and 30, currents Ia and Ib flow through the transistors $Q_a$ and $Q_b$ respectively, and an output current $i_1$ flows through an output terminal 44 connected to one of the output connection nodes, for example, the node 40. Then, the following equation is obtained.

$$V_{in} = N \frac{KT}{q} \left( \ln \frac{I_a}{I_o} - \ln \frac{I_b}{I_o} \right) = \quad (1)$$

$$N V_t \cdot \ln \frac{I_a}{I_b} = N V_t \cdot \ln \frac{I + i_1}{I - i_1}$$

where K is Boltzman's constant, T is an absolute temperature, q is an electron charge, $$V_T \left( = \frac{KT}{q} \right)$$

is a thermal voltage, $I_o$ is a reverse saturation current of the transistor and the diode, and I is half of the current of the first constant current source 24.

The output current $i_1$ is expressed as follows by changing the above equation (1):

$$i_1 = \frac{\left( \exp \cdot \frac{V_{in}}{N \cdot V_T} \right) - 1}{\left( \exp \cdot \frac{V_{in}}{N \cdot V_T} \right) + 1} \cdot I \quad (2)$$

The mutual conductance ($gm_N$) of the first differential amplifier unit 20 is obtained by differentiating the output current $i_1$ with respect to the input voltage Vin. Accordingly:

$$gm_N = \frac{\partial i_1}{\partial V_{in}} = \frac{2 \cdot I}{N \cdot V_T} \cdot \frac{\exp \cdot \frac{V_{in}}{N \cdot V_T}}{\left( 1 + \exp \cdot \frac{V_{in}}{N \cdot V_T} \right)^2} \quad (3)$$

Figure 3:
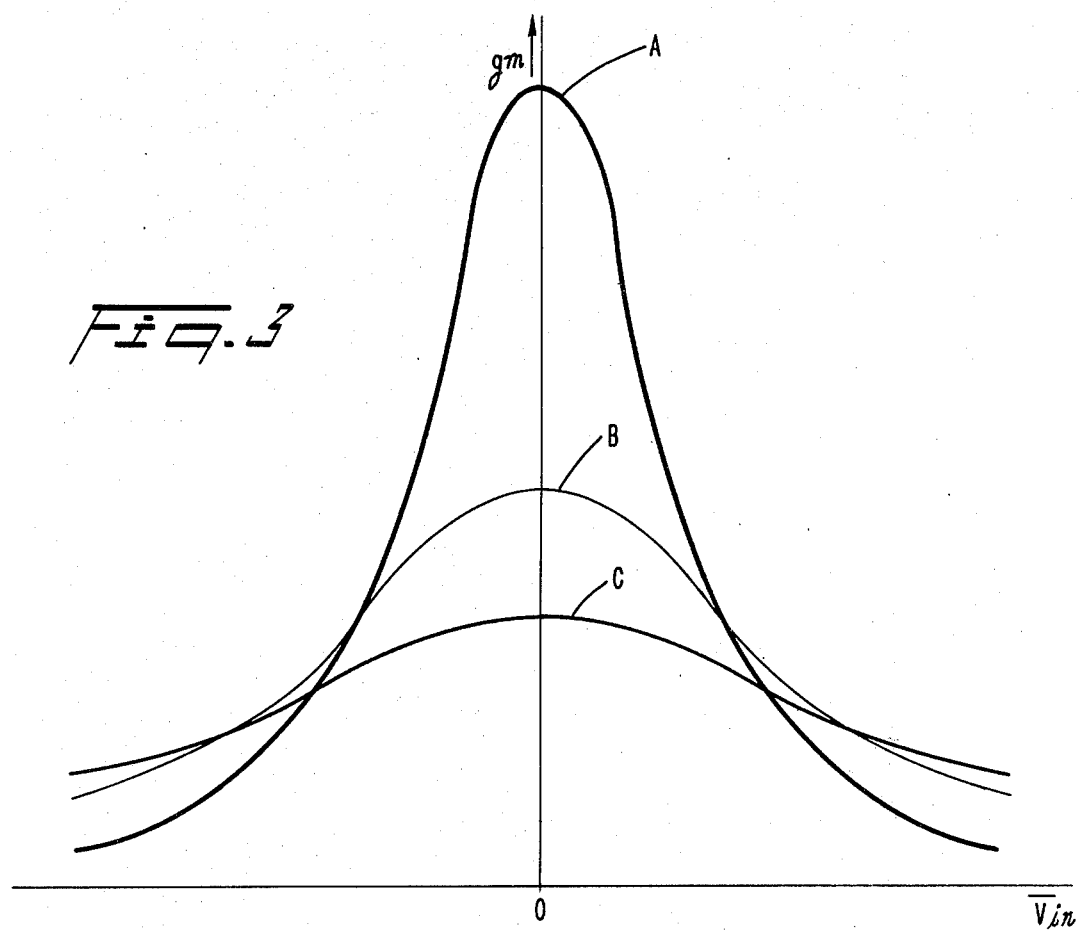
FIG. 3 is a graph showing gm characteristic curves of one of the differential amplifier units in the circuit shown in FIG. 2.

The $gm_N$ varies in accordance with the input voltage Vin as a variable, and can be presented as shown in FIG. 3. The curves A, B and C in FIG. 3 reflect the gm characteristics when N is one, two and three, respectively. As is clear from the shapes of the three curves A, B and C, the central peak of the curve lowers with the increasing of N and the slopes of both sides of the central peak become more gentle with the increasing of N.

The second differential amplifier unit 22 has the mutual conductance $gm_M$ which is expressed, analogously to equation 3 for $gm_N$, as follows:

$$gm_M = \frac{2 \cdot \alpha I}{M \cdot V_T} \cdot \frac{\exp \cdot \frac{V_{in}}{M \cdot V_T}}{\left( 1 + \exp \cdot \frac{V_{in}}{M \cdot V_T} \right)^2} \quad (4)$$

The whole mutual conductance $gm_W$ of the whole circuit can be obtained as a difference between $gm_N$ and $gm_M$, because the output currents based on respective differential amplifier units 20 and 22; operated in opposite directions at the output node 40.

$$gm_W = gm_N - gm_M = \quad (5)$$

$$\frac{2I}{V_T} \left( \frac{\exp \cdot \frac{V_{in}}{NV_T}}{\left( 1 + \exp \cdot \frac{V_{in}}{NV_T} \right)^2} - \frac{\alpha \cdot \exp \cdot \frac{V_{in}}{MV_T}}{\left( 1 + \exp \cdot \frac{V_{in}}{MV_T} \right)^2} \right)$$

Figure 4:
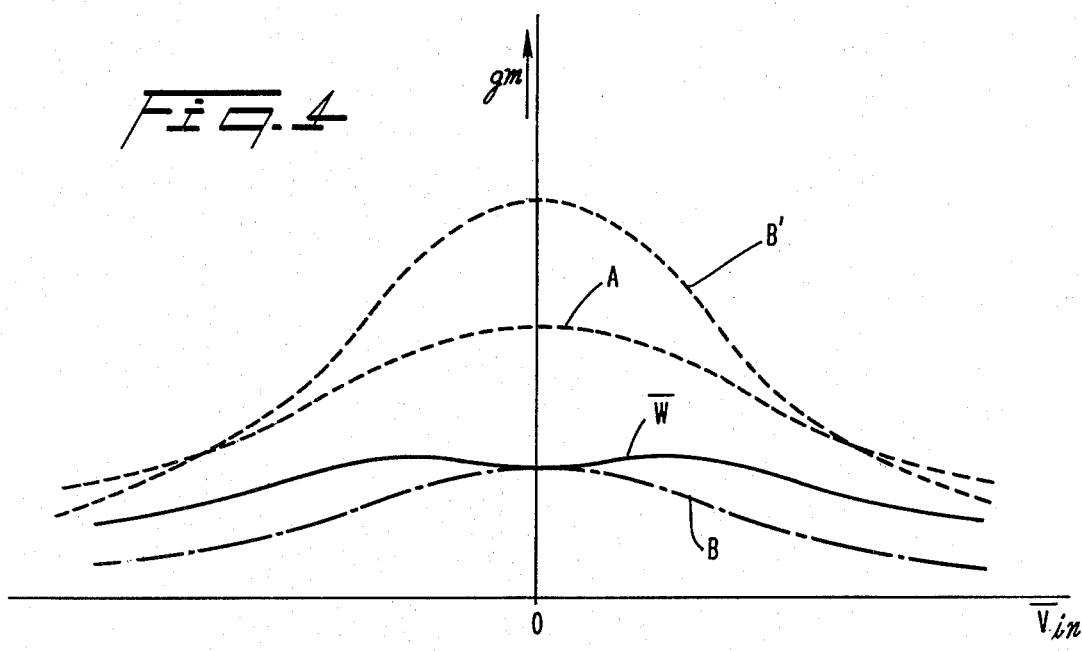
FIG. 4 shows graphs of gm characteristic curves of the circuit shown in FIG. 2.
Figure 6:
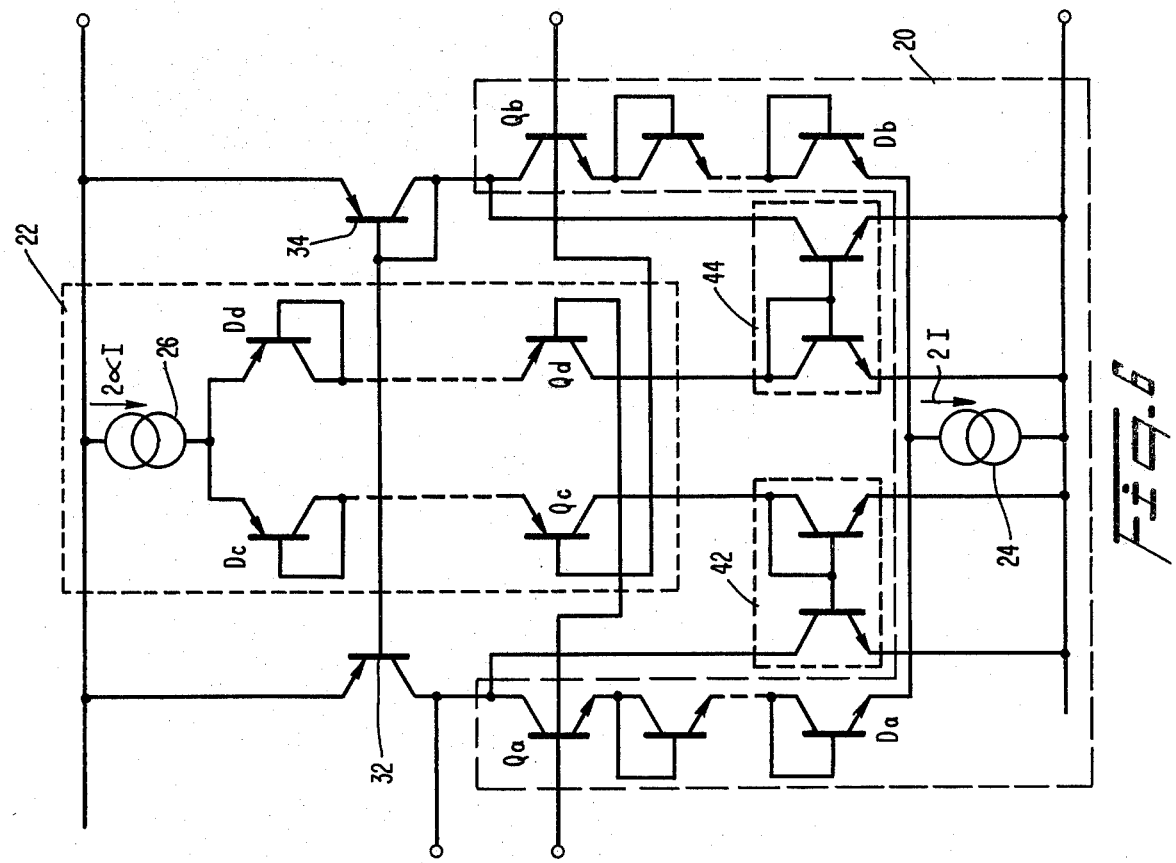

The $gm_W$ characteristic curve is presented as a compound of both characteristics $gm_N$ and $gm_M$, for example, as shown in FIG. 4. In FIG. 4, curves A and B are the gm characteristic curves of the differential amplifier units 20, respectively and 22 when N=3, M=2 and $\alpha = \frac{1}{3}$. The curve W is the gm characteristic curve of the whole circuit. Curve B' is a reference curve where α=1. The gm$_M$ has a characteristic curve B or B' similar to the characteristic curve A for gm$_N$. As a result, the gm$_W$ curve has a relatively flat portion about its center.

Figure 5:
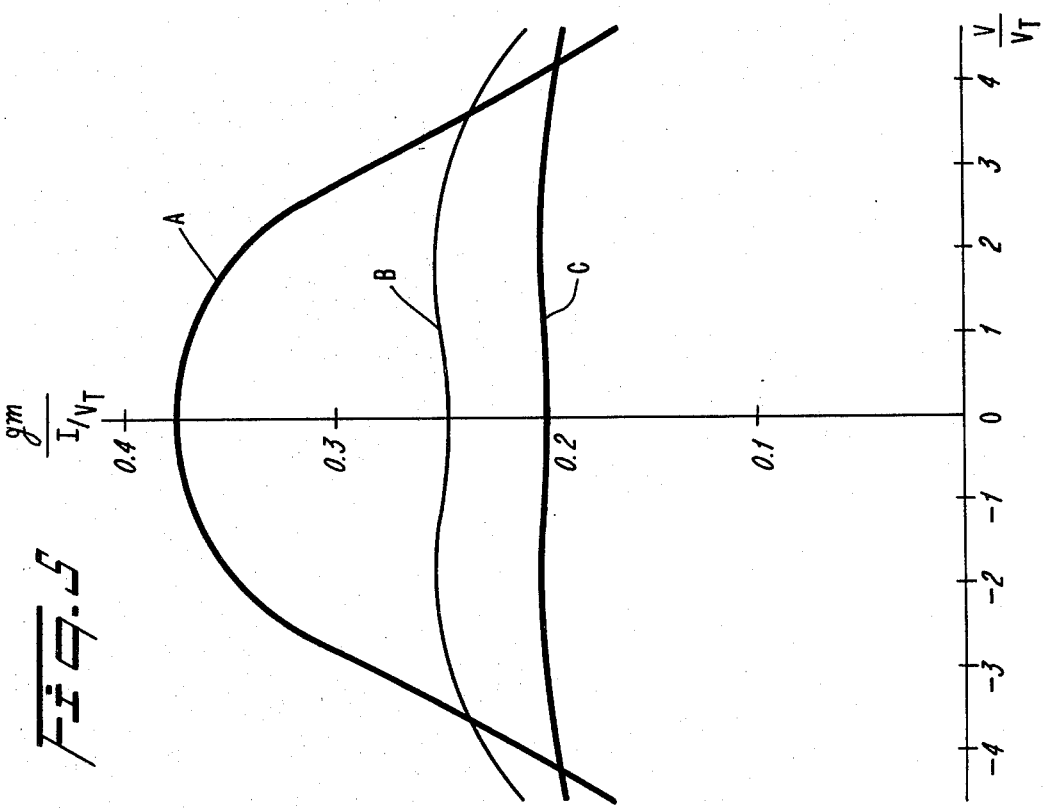
FIG. 5 shows graphs of gm characteristic curves of the circuit shown in FIG. 2 in several cases.
Figure 1:
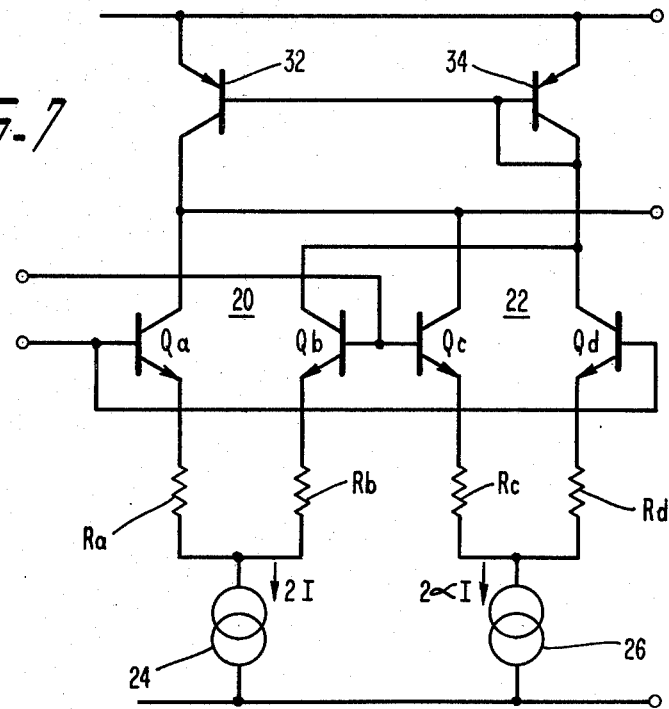

FIG. 5 shows a graph on which gm$_W$ in several cases wherein N, M and α are selected as specific numbers. Curve A depicts the characteristic curve gm$_W$ when N=2, M=1 and α=¼. The graph B reflects the gm$_W$ characteristic curve when N=3, M=2 and α=½. And the graph C reflects the gm$_W$ characteristic curve when N=4, M=3, and α=3/5.

The first embodiment described above can be modified as shown in FIG. 6. This modification is a differential amplifier circuit in which respective pairs of transistors Q$_a$, Q$_b$ and Q$_c$, Q$_d$ in the amplifier units 20 and 22 are of opposite conductivity types. For example, the transistor Q$_a$ and Q$_b$ are NPN types, but on the other hand, the transistor Q$_c$ and Q$_d$ are PNP types.

The collector of the NPN transistor Q$_a$ in the first differential amplifier unit 20 and the PNP transistor Q$_c$ in the second differential amplifier unit 22 are connected to each other via a current mirror circuit 42, and the collectors of the NPN transistor Q$_b$ in the first amplifier 20 and the PNP transistor Q$_d$ in the second amplifier 22 are also connected to each other via a current mirror circuit 44. Further, there are connected in series junction diode stacks D$_a$ and D$_b$ having (N-1) number of diode connected transistors between transistors Q$_a$ and Q$_b$, respectively, and associated constant current source 24. Also, there are connected in series junction diode stacks D$_c$ and D$_d$ having (M-1) number of diode connected transistors between transistors Q$_c$ and Q$_d$, respectively, and associated constant current source 26. In this modification, similar effects as those of the first embodiment are obtained.

Further, the first embodiment can be modified as shown in FIG. 7. This modification is a differential amplifier circuit in which resistors R$_a$, R$_b$, R$_c$ and R$_d$ are respectively connected between respective transistors Q$_a$, Q$_b$, Q$_c$ and Q$_d$ and common constant current sources 24 and 26 in place of the diode stacks D$_a$, D$_b$, D$_c$ and D$_d$ shown in FIG. 2. The resistance of the resistors in the same amplifier unit are the same, but the resistors in respective units are different. Resistors R$_a$ and R$_b$ in a first differential amplifier unit 20, for example, are selected to have larger resistances than those of the resistors R$_c$, R$_d$ in a second differential amplifier unit 22. Amplifier unit 22 is associated with constant current source 26 supplying a smaller current than that of constant current source 24 which is associated with the amplifier unit 20. In this modification, the form of the gm characteristic curve of the whole circuit can be continuously changed by varying resistances of the resistors R$_a$, R$_b$ and R$_c$, R$_d$. However, the linearity of the gm characteristic curve about center of its graph becomes inferior than that in case of diode stacks (in FIG. 2).

Figure 8:
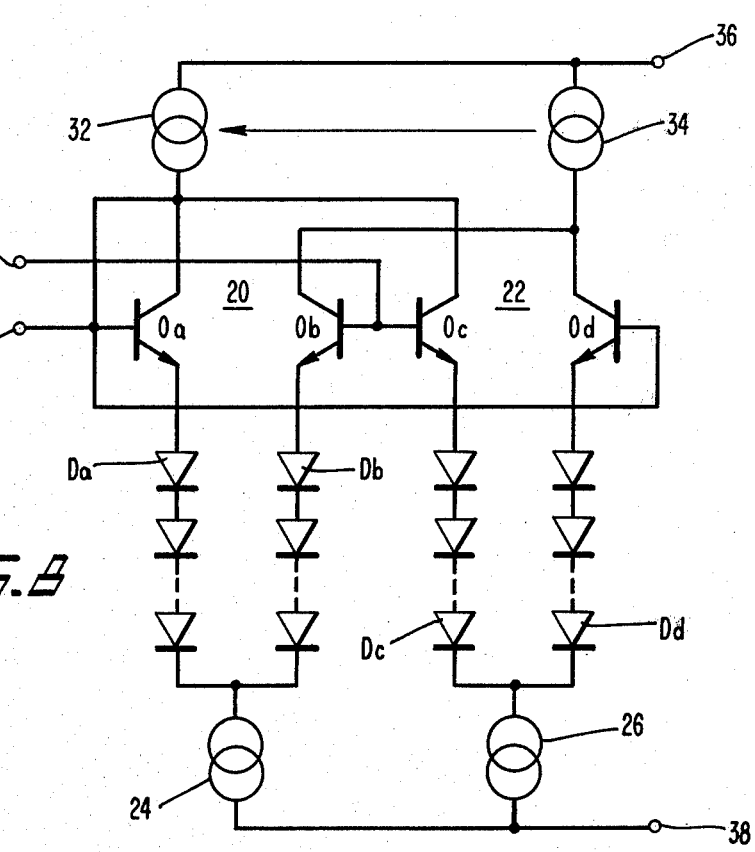

Still further, the present invention can be used for a variable impedance circuit. That is, the variable impedance circuit according to the present invention is realized by, for example, connecting the collectors of the transistors Q$_a$, Q$_c$ to the first input terminal 28 as shown in FIG. 8 instead of connecting the collectors to the output terminal 40 as shown in FIG. 2. By means of this circuit connection, an impedance Z of the whole circuit is obtained as a reciprocal of the mutual conductance gm$_W$ expressed by equation (5). That is $$Z = \frac{\partial V_{in}}{\partial i} = \frac{1}{gm_W} = \frac{V_I}{2I} \cdot \quad (6)$$

$$\frac{1}{\left\{ \frac{\exp\frac{V_{in}}{N \cdot V_T}}{\left(1 + \exp\frac{V_{in}}{N \cdot V_T}\right)^2} - \alpha \cdot \frac{\exp\frac{V_{in}}{M \cdot V_T}}{\left(1 + \exp\frac{V_{in}}{M \cdot V_T}\right)^2} \right\}}$$

Accordingly, the impedance Z also has a flat portion in its characteristic curve. And the impedance Z varies in accordance with the controlling of the currents 2I and 2 αI of the constant current sources 24 and 26 in keeping the ratio α between the constant currents.

What is claimed is:

1. A differential amplifier circuit comprising:
    a pair of differential amplifier units, each unit including a pair of equal impedance transistor circuits, each transistor circuit of a pair including a transistor having its emitter connected to a common current source individual to the pair, one current source being larger than the other, the emitters of the transistors of the one unit connected to the larger current source being coupled through individual ones of a first pair of equal impedances to the associated current source, the individual impedances of the first pair being larger than any impedance between the emitters of the transistors of the other unit and the smaller current source,
    wherein the bases of the individual transistors in each unit are connected to the bases of different ones of the transistors of the other unit and the collectors of the individual transistors of each unit are connected to the collectors of different ones of the transistors of the other unit in which the bases of the transistors in the pairs of units are not connected to each other.

2. A differential amplifier circuit according to claim 1 wherein the pair of transistors connected to the smaller current source are coupled to the smaller current source through equal value impedances.

3. A differential amplifier circuit according to claim 1 or 2 wherein said impedances are sets of connected junction diodes.

4. A differential amplifier circuit according to claim 1 or 2 wherein the impedances are resistors.

5. A differential amplifier circuit according to claim 1 wherein said transistors are of the same conductivity type.

6. A differential amplifier circuit according to claim 1 wherein the transistors in one of the units are of one conductivity type, the transistors in the other unit are of a different conductivity type and said collectors of the individual transistors in one of the units are connected to said different ones of the transistors in the other unit via current mirror circuits.

7. A differential amplifier circuit according to claim 1 wherein the amplifier circuit further comprises an input circuit connected to one of said bases and an output circuit connected to one of said collectors.

8. A differential amplifier circuit according to claim 1 wherein one of said collectors is connected to one of said bases and wherein the circuit further comprises an input circuit connected to one of said bases.

* * * * *